United States Patent
Kwon et al.

(10) Patent No.: US 10,382,040 B2
(45) Date of Patent: Aug. 13, 2019

(54) HIGH VOLTAGE LEVEL SHIFTING (HVLS) CIRCUIT AND RELATED SEMICONDUCTOR DEVICES

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Yi Jin Kwon, Shanghai (CN); Hao Ni, Shanghai (CN); Chang Wei Yin, Shanghai (CN); Hong Yu, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

(*) Notice: Subject to any disclaimer, the term of this patent is extended or adjusted under 35 U.S.C. 154(b) by 0 days.

(21) Appl. No.: 16/041,640

(22) Filed: Jul. 20, 2018

(65) Prior Publication Data
US 2019/0036532 A1 Jan. 31, 2019

(30) Foreign Application Priority Data
Jul. 27, 2017 (CN) .......................... 2017 1 0620849

(51) Int. Cl.
H03K 19/0185 (2006.01)
H03K 17/687 (2006.01)
H03K 3/356 (2006.01)

(52) U.S. Cl.
CPC ..... H03K 19/018521 (2013.01); H03K 3/356 (2013.01); H03K 3/356017 (2013.01);
(Continued)

(58) Field of Classification Search
None
See application file for complete search history.

(56) References Cited

U.S. PATENT DOCUMENTS 6,600,358 B1* 7/2003 Chan ................... H03K 19/0013
326/81
7,151,400 B2* 12/2006 Chen ................. H03K 3/356113
327/333
(Continued)

Primary Examiner — Minh D A
Assistant Examiner — James H Cho
(74) Attorney, Agent, or Firm — Innovation Counsel LLP

(57) ABSTRACT

A high voltage level shifting circuit and related semiconductor devices are presented. The circuit comprises: a level conversion circuit that converts an input signal with a first high voltage to an output signal with a second high voltage; a first switch having a first node connected to a first power source and a second node connected to a control node of a first transistor; a second switch having a first node connected to the control node of the first transistor and a second node connected to a first connection node; and a switch control circuit connected to the first switch and the second switch and controls them not to be close at the same time. By adding these two switches to the level conversion circuit, this inventive concept substantially lowers the static current generated during a high voltage level conversion process.

16 Claims, 4 Drawing Sheets

(52) U.S. Cl.
CPC . *H03K 3/356069* (2013.01); *H03K 3/356113* (2013.01); *H03K 17/687* (2013.01); *H03K 19/0185* (2013.01)

(56) References Cited

U.S. PATENT DOCUMENTS 9,257,973 B1 *  2/2016  Shay ................ H03K 3/356104
9,780,790 B2 *  10/2017 Potluri ............. H03K 19/01852

* cited by examiner

HIGH VOLTAGE LEVEL SHIFTING (HVLS) CIRCUIT AND RELATED SEMICONDUCTOR DEVICES

CROSS-REFERENCE TO RELATED APPLICATION

This application claims priority to and benefit of Chinese Patent Application No. 201710620849.2 filed on Jul. 27, 2017, which is incorporated herein by reference in its entirety.

BACKGROUND

(a) Field of the Invention

This inventive concept relates to voltage conversion technology and, more specifically to a High Voltage Level Shifting (HVLS) circuit and related semiconductor devices.

(b) Description of the Related Art

Most of the operating instructions in a conventional Non-Volatile Memory (NVM) are implemented through level shifting circuits such as bit line driver or word line driver. For example, during a write operation, a conventional NVM relies on a HVLS circuit to transmit a 10-16V voltage from an analog pumping module.

A conventional HVLS circuit is implemented through a current mirror circuit and typically comprises a High-Voltage N-type Metal-Oxide-Semiconductor (HVNMOS) transistor and a High-Voltage P-type Metal-Oxide-Semiconductor (HVPMOS) transistor. Due to a high threshold voltage ($V_t$) of a HVNMOS transistor, changing a HVNMOS transistor from blocking state to conducting state (or vice versa) takes relatively long time, which in turn leads to substantial power consumption. Thus, voltage conversion through a conventional HVLS circuit generates a large amount of conversion current (static current) and needs a relatively long time to complete.

SUMMARY

Based on the investigations on the limitations of conventional HVLS circuits, this inventive concept presents a HVLS circuit that has a substantially lower static current during the voltage conversion process.

This HVLS circuit comprises:

a level conversion circuit comprising a first transistor, a second transistor, a third transistor, and a fourth transistor, with the first and the second transistors having a first conductivity type and the third and the fourth transistors having a second conductivity type, wherein the level conversion circuit converts an input signal having a first high voltage to an output signal having a second high voltage that is higher than the first high voltage, and wherein the first transistor is connected to the third transistor at a first connection node, the second transistor is connected to the fourth transistor at a second connection node, and a control node of the first transistor is connected to a control node of the second transistor;

a first switch having a first node connected to a first power source and a second node connected to the control node of the first transistor;

a second switch having a first node connected to the control node of the first transistor and a second node connected to the first connection node; and a switch control circuit connected to the first switch and the second switch, and controls them not to be close at the same time.

Additionally, the aforementioned circuit may further comprise a regulator circuit connected to the level conversion circuit, wherein the regulator circuit regulates the output signal of the level conversion circuit.

Additionally, in the aforementioned circuit, the switch control circuit may comprise:

a first inverter having an input node connected to the second connection node and an output node connected to a control node of the first switch; and a second inverter having an input node connected to the output node of the first inverter and an output node connected to a control node of the second switch.

Additionally, in the aforementioned circuit, the first switch may be an electrical relay, a P-type Metal-Oxide-Semiconductor (PMOS) transistor, an N-type Metal-Oxide-Semiconductor (NMOS) transistor, an N-P-N transistor, or a P-N-P transistor, and the second switch may be an electrical relay, a PMOS transistor, an NMOS transistor, an N-P-N transistor, or a P-N-P transistor.

Additionally, in the aforementioned circuit, the first transistor may comprise one or more transistors, the second transistor may comprise one or more transistors, and the first transistor and the second transistor may comprise different number of transistors.

Additionally, in the aforementioned circuit, the second transistor may comprise k times as many transistors as the first transistor, wherein k is an integer greater than 1.

Additionally, the aforementioned circuit may further comprise:

an output buffer comprising:
  a first output inverter having an input node connected to the second connection node; and
  a second output inverter having an input node connected to an output node of the first output inverter, and an output node acting as an output node of the (HVLS) circuit.

Additionally, in the aforementioned circuit, the regulator may comprise a regulating PMOS transistor having a source connected to the first power source, a drain connected to the second connection node, and a gate connected to the output node of the first output inverter.

Additionally, in the aforementioned circuit, the first conductivity type may be P type and the second conductivity type may be N type.

Additionally, in the aforementioned circuit, the third transistor may be a first high-voltage NMOS transistor, the fourth transistor may be a second high-voltage NMOS transistor, a drain of the first high-voltage NMOS transistor may be connected to a drain of the first transistor, and a drain of the second high-voltage NMOS transistor may be connected to a drain of the second transistor.

Additionally, in the aforementioned circuit, the level conversion circuit may further comprise a fifth transistor and a sixth transistor, wherein the fifth transistor is a first low-threshold NMOS transistor, the sixth transistor is a second low-threshold NMOS transistor, the third transistor is a first low-voltage NMOS transistor, and the fourth transistor is a second low-voltage NMOS transistor, wherein a drain of the first low-voltage NMOS transistor is connected to a source of the first low-threshold NMOS transistor, a drain of the second low-voltage NMOS transistor is connected to a drain of the second low-threshold NMOS transistor, and wherein a gate of the first low-threshold NMOS transistor and a gate of the second low-threshold NMOS transistor are connected to a second power source, a drain of the first low-threshold NMOS transistor is connected to a drain of the first transistor, and a drain of the second low-threshold NMOS transistor is connected to a drain of the second transistor.

This inventive concept further presents a semiconductor device comprising the aforementioned HVLS circuit.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1:
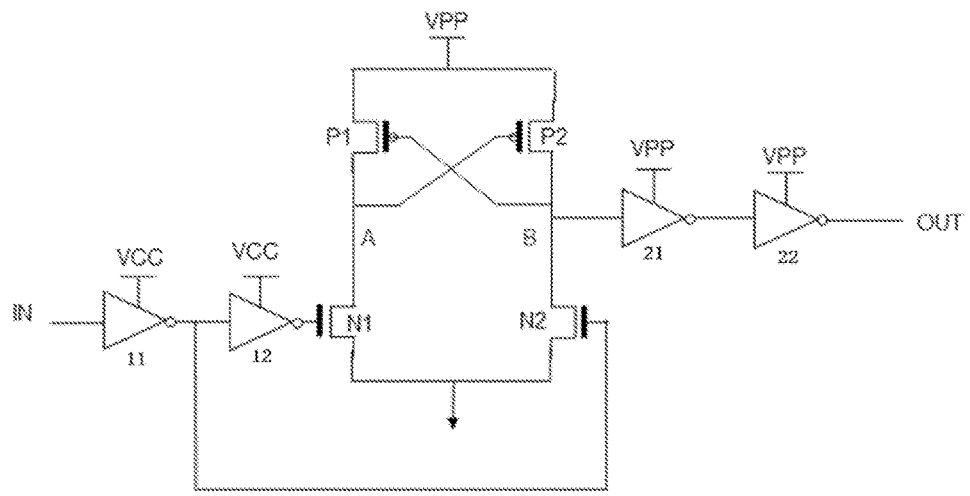
FIG. 1 shows a diagram illustrating a conventional HVLS circuit.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

Based on the investigations on the limitations of conventional HVLS circuits, this inventive concept presents a novel HVLS circuit. Details of this circuit are described below in comparison with conventional HVLS circuits.

FIG. 1 shows a diagram illustrating a conventional HVLS circuit. As shown in FIG. 1, a conventional HVLS circuit may comprise an input buffer, a current mirror circuit, and an output buffer. The current mirror circuit is a main unit for voltage conversion, which converts an input signal having a first high voltage to an output signal having a second high voltage that is higher than the first high voltage.

More specifically, as shown in FIG. 1, the current mirror circuit converts an input signal IN that has a base voltage (a low voltage L, or GND) and a first high voltage H1 (Vcc) to an output signal OUT that has a base voltage L and a second high voltage H2 (Vpp).

Referring to FIG. 1, the current mirror circuit may comprise a first transistor P1, a second transistor P2, a third transistor N1, and a fourth transistor N2, with the first transistor P1 and the second transistor P2 having a first conductivity type, and the third transistor N1 and fourth transistor N2 having a second conductivity type. Opposite signals are provided to a gate of the third transistor N1 and a gate of the fourth transistor N2.

The first transistor P1 and the third transistor N1 are connected at a first connection node A, and the second transistor P2 and the fourth transistor N2 are connected at a second connection node B.

Referring to FIG. 1, the input buffer may comprise a first input inverter 11 and a second input inverter 12. An input node of the first input inverter 11 is an input node of the HVLS circuit, an output node of the first input inverter 11 is connected to an input node of the second input inverter 12. An output node of the second input inverter 12 is connected to a gate of the third transistor N1, the output node of the first input inverter 11 is connected to a gate of the fourth transistor N2. Working voltages of the first input inverter 11 and the second input inverter 12 are the first high voltage H1 (Vcc).

A drain of the third transistor N1 is connected to a drain of the first transistor P1, a drain of the fourth transistor N2 is connected to a drain of the second transistor P2, and a source of the third transistor N1 and a source of the fourth transistor N2 are connected to the ground.

The second high voltage H2 (Vpp) is provided to a source of the first transistor P1 and a source of the second transistor P2. A gate of the first transistor P1 is connected to the drain of the second transistor P2, and a gate of the second transistor P2 is connected to the drain of the first transistor P1, forming a cross coupling circuit. An output signal (So) of the current mirror circuit is sent to the output buffer from the second connection node B connecting the second transistor P2 and the fourth transistor N2.

As shown in FIG. 1, the output buffer comprises a first output inverter 21 and a second output inverter 22. An input node of the first output inverter 21 is connected to the second connection node B, an input node of the second output inverter 22 is connected to an output node of the first output inverter 21, and an output node of the second output inverter 22 is an output node OUT of the HVLS circuit.

In the HVLS circuit of FIG. 1, when the input signal IN is a low voltage (e.g., GND), the gate of the third transistor N1 is at the low voltage (e.g., GND), and the gate of the fourth transistor N2 is at the first high voltage H1 (e.g., Vcc). Thus, the third transistor N1 is in blocking state, the fourth transistor N2 is in conducting state, the second connection node B is at the low voltage (e.g., GND), and the output signal OUT of the output buffer is the low voltage (e.g., GND).

When the input signal IN is a high voltage (e.g., Vcc), the gate of the third transistor N1 is at the first high voltage H1 (Vcc), and the gate of the fourth transistor N2 is at the low voltage (e.g., GND). Thus, the third transistor N1 is in conducting state, the fourth transistor N2 is in blocking state, the gate of the second transistor P2 is at the low voltage (e.g., GND). Hence, the second transistor P2 is in conducting state, the first transistor P1 is in blocking state, the second connection node B is at the second high voltage H2 (Vpp), and the output signal OUT of the output buffer is the second high voltage H2 (Vpp).

As described above, the HVLS circuit of FIG. 1 converts an input signal IN having a base voltage of GND and a first high voltage of H1 to an output signal OUT having a base voltage of GND and a second high voltage of H2.

In the HVLS circuit of FIG. 1, the first conductivity type may be P type and the second conductivity type may be N type. The first transistor P1 and the second transistor P2 are HVPMOS transistors, the third transistor N1 and the fourth transistor N2 are HVNMOS transistors. Due to a high threshold voltage ($V_t$) of a HVNMOS transistor, changing a HVNMOS transistor from a blocking state to a conducting state takes relatively long time and consumes substantial power. When the input signal is a high voltage, there exists a large conversion current (static current) in the current path between Vpp and GND. As a result, voltage conversion by conventional HVLS circuits generates a large conversion current (static current) and takes a relatively long time.

Based on the investigations on the limitations of conventional HVLS circuits, this inventive concept presents a HVLS circuit that remedies at least one limitation of conventional HVLS circuits. This HVLS is described below with reference to the accompanying drawings.

Figure 2:
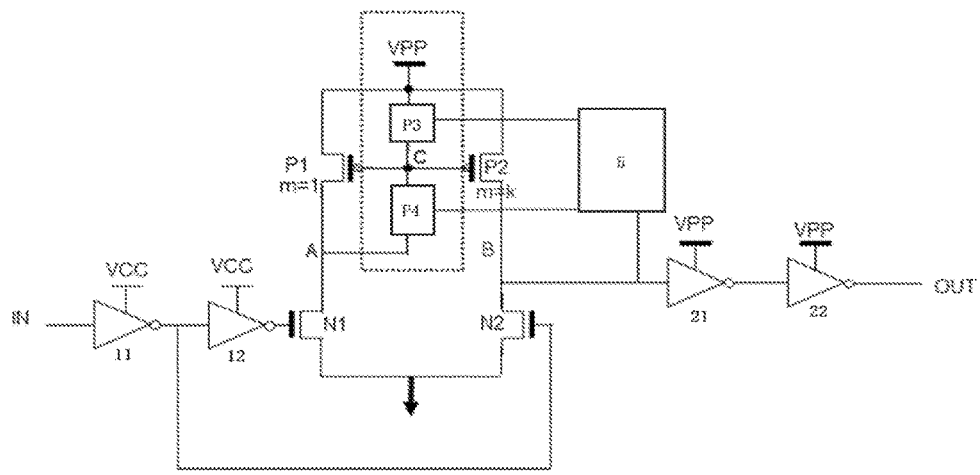
FIG. 2 shows a diagram illustrating a HVLS circuit in accordance with a first embodiment of this inventive concept.

FIG. 2 shows a diagram illustrating a HVLS circuit in accordance with a first embodiment of this inventive concept. As shown in FIG. 2, the HVLS circuit comprises a level conversion circuit, a first switch P3, a second switch P4, and a switch control circuit 5. The level conversion circuit converts an input signal having a base voltage GND and a first high voltage Vcc to an output signal having a base voltage GND and a second high voltage Vpp, with the second high voltage Vpp higher than the first high voltage Vcc.

The level conversion circuit in this embodiment is similar to the current mirror circuit shown in FIG. 1, it comprises a first transistor P1, a second transistor P2, a third transistor N1, and a fourth transistor N2, with the first transistor P1 and the second transistor P2 having a first conductivity type, and the third transistor N1 and the fourth transistor N2 having a second conductivity type. The first transistor P1 and the third transistor N1 are connected at a first connection node A, the second transistor P2 and the fourth transistor N2 are connected at a second connection node B.

The difference between this level conversion circuit and the current mirror circuit of FIG. 1 is that, in this level conversion circuit, a control node of the first transistor P1 and a control node of the second transistor P2 are connected at a third connection node C, as shown in FIG. 2.

A first node of the first switch P3 is connected to a first power source that has a source voltage of a second high voltage (Vpp), a second node of the first switch P3 is connected to the third connection node C.

A first node of the second switch P4 is connected to the third connection node C, and a second node of the second switch P4 is connected to the first connection node A.

The switch control circuit 5 is connected to the first switch P3 and the second switch P4, and controls these two switches not to be close at the same time.

As described above, the HVLS circuit in this embodiment has a first switch P3 and a second switch P4. Controlled by a switch control circuit, these two switches will not be close at the same time. When the input signal is a first high voltage (e.g., logic high), a direct current path between the first power source (Vpp) and the ground GND is severed, thus the static current generated during the level conversion process is substantially reduced, and the level conversion process can be completed much faster.

Referring to FIG. 2, in one embodiment of this inventive concept, the HVLS circuit may further comprise an input buffer and an output buffer, similar to those shown in FIG. 1.

In one embodiment, the first switch P3 may be an electrical relay, a PMOS transistor, an NMOS transistor, an N-P-N transistor, or a P-N-P transistor, the second switch P4 may be an electrical relay, a PMOS transistor, an NMOS transistor, an N-P-N transistor, or a P-N-P transistor.

In one embodiment, the switch control circuit 5 may be a delay module comprising two serially connected inverters.

In one embodiment, the first conductivity type may be P type, and the second conductivity type may be N type.

Figure 3:
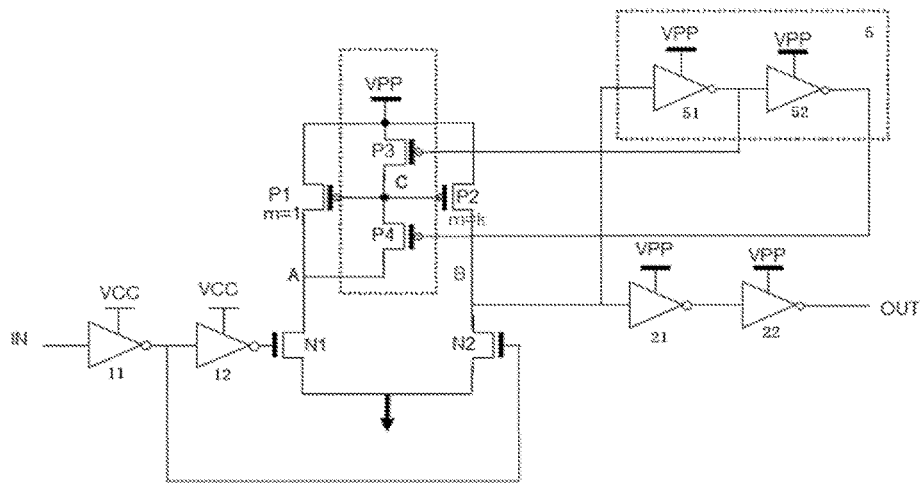
FIG. 3 shows a diagram illustrating a HVLS circuit in accordance with a second embodiment of this inventive concept.

FIG. 3 shows a diagram illustrating a HVLS circuit in accordance with a second embodiment of this inventive concept, which is one possible implementation of the circuit of FIG. 2.

In the circuit of FIG. 3, the first conductivity type is P type, and the second conductivity type is N type. The third transistor N1 is a first High-Voltage NMOS (HVNMOS) transistor, the fourth transistor N2 is a second High-Voltage NMOS (HVNMOS) transistor. The first transistor P1 and the second transistor P2 are High-Voltage PMOS (HVPMOS) transistors. A drain of the first HVNMOS transistor is connected to a drain of the first transistor P1, a drain of the second HVNMOS transistor is connected to a drain of the second transistor P2.

The first switch P3 and the second switch 4 are HVPMOS transistors. A source of the first switch P3 is connected to a first power source that has a source voltage of a second high voltage (Vpp), a drain of the first switch P3 is connected to the third connection node C. A source of the second switch P4 is connected to the third connection node C, and a drain of the second switch P4 is connected to the first connection node A.

Referring to FIG. 3, in one embodiment, a switch control circuit 5 may be a delay module comprising a first inverter 51 and a second inverter 52. An input node of the first inverter 51 is connected to the second connection node B, an output node of the first inverter 51 is connected a gate of the first switch P3. An input node of the second inverter 52 is connected the output node of the first inverter 51, and an output node of the second inverter 52 is connected to a gate of the second switch P4.

Optimally, in one embodiment, the first inverter 51 and the second inverter 52 may comprise tunnel field-effect transistors (TFET).

In the HVLS circuit of FIG. 3, when the input signal IN is a low voltage (e.g., GND), the gate of the third transistor N1 is at the low voltage (e.g., GND), the gate of the fourth transistor N2 is at the first high voltage H1 (Vcc). Thus, the third transistor N1 is in blocking state and the fourth transistor N2 is in conducting state, the second connection node B is at the low voltage (e.g., GND), and the output signal OUT of the output buffer is the low voltage (e.g., GND).

When the input signal IN is at the first high voltage (e.g., Vcc), the gate of the third transistor N1 is at the first high voltage H1 (Vcc), and the gate of the fourth transistor N2 is at the low voltage (e.g., GND). Thus, the third transistor N1 is in conducting state and the fourth transistor N2 is in blocking state. The first connection node A is at the low voltage (e.g., GND), the voltage at the second connection node B gradually increases from a low voltage (L) to the second high voltage H2, the voltage at the gate of the first switch P3 decreases from the second high voltage H2 to the low voltage (L), and the voltage at the gate of the second switch P4 increases from the low voltage (L) to the second high voltage H2. Thus, the first switch P3 and the second switch P4 will not be close (i.e., in conducting state) at the same time.

In a level conversion process, at first, the second switch P4 will be in conducting state, and the first switch P3 will be in blocking state at this time. When the second switch P4 is in conducting state, the voltage on the third connection node C will be the low voltage, which in turn drives the second transistor P2 into conducting state, and the voltages at the second connection node B and the output node of the HVLS circuit are increased. When the second connection node B has a high voltage, the second switch P4 changes to blocking state and first switch P3 changes in conducting state, and a direct current path between the first power source (Vpp) and the ground GND is severed. As a result, the static current generated during the level conversion process is substantially reduced, which speeds up the level conversion process.

As described above, the circuit in this embodiment has two PMOS transistors (a first switch P3 and a second switch P4), and the voltage at the gates of these PMOS transistors are controlled by time-delayed signals which are in turn controlled by the switch control circuit 5. The first switch P3 and the second switch P4 in this circuit will not be close (i.e., in conducting state) at the same time, thus a direct current path between the first power source (Vpp) and the ground GND is severed when the input signal is a high voltage. As a result, the static current during the level conversion process can be substantially reduced.

In one embodiment, the input signal (the first high voltage) may be 1.5V, the output signal (the second high voltage) may be 6V. In this case, the HVLS circuit may further comprise an output buffer, similar to that shown in FIG. 1, through which the output signal of the circuit is provided.

Referring to FIG. 3, in one embodiment, the first transistor P1 and the second transistor P2 may each comprise one or more transistors, and the first transistor P1 and the second transistor P2 may comprise different number of transistors. In one embodiment, the second transistor P2 may comprise k times as many transistors as the first transistor P1, wherein k is an integer greater than 1.

If the first transistor P1 and the second transistor P2 comprise the same number of transistors, due to the channel resistance in the second switch P4, the current in the third transistor N1 is not able to match the current in the fourth transistor N2 when the input signal changes, and the voltage change rate at the second connection node B will be affected by the current in the second transistor P2. Therefore, the number of transistors in the first transistor P1 and the second transistor P2 will affect voltage conversion speed.

In this embodiment, the first transistor P1 and the second transistor P2 comprise different number of transistors, therefore have different current-driving capabilities. This discrepancy helps to speed up the conversion process in the HVLS circuit. The difference in the transistor numbers between the first transistor P1 and the second transistor P2 also determines an upper limit of a voltage that can be converted by this HVLS circuit.

Figure 4:
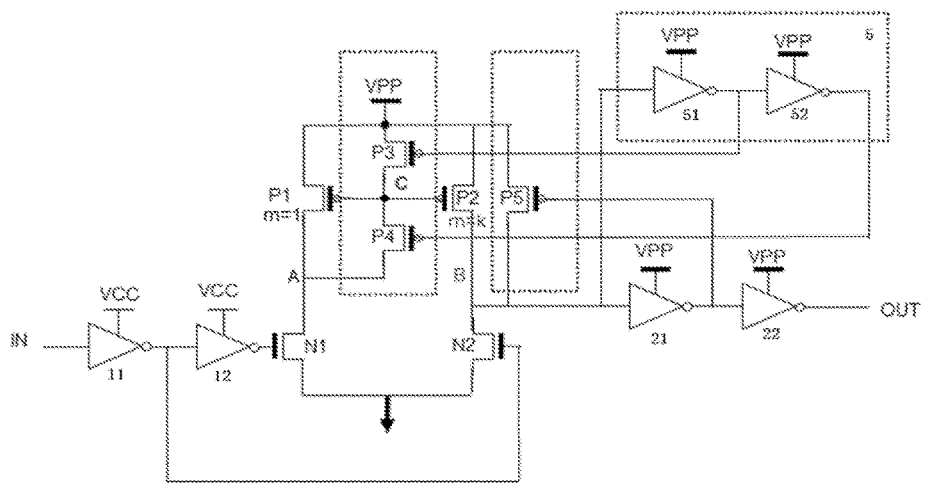
FIG. 4 shows a diagram illustrating a HVLS circuit in accordance with a third embodiment of this inventive concept.

FIG. 4 shows a diagram illustrating a HVLS circuit in accordance with a third embodiment of this inventive concept. Compared to the HVLS circuit in FIG. 3, the HVLS circuit in FIG. 4 further comprises a regulator circuit connected to the level conversion circuit. The regulator circuit regulates the output signal of the level conversion circuit.

Referring to FIG. 4, in one embodiment, the regulator circuit may comprise a regulating PMOS transistor P5. The regulating PMOS transistor P5 comprises a source connected to the first power source (Vpp), a drain connected to the second connection node B, and a gate connected to the output node of the first output inverter 21.

In this embodiment, the regulating PMOS transistor P5 may eliminate voltage floating at the second connection node B when the input signal is a high voltage. When the input signal IN of the HVLS circuit increases from a low voltage L to the first high voltage H1, the voltage at the gate of the fourth transistor N2 decreases from the first high voltage H1 to the low voltage L, thus the fourth transistor N2 enters blocking state, blocking all the currents going through. Thus, the second connection node B, with its voltage increased from the low voltage L to the second high voltage H2, is at a floating state. With the regulating PMOS transistor P5 included in the circuit, since the second connection node B is connected to, through the first output inverter 21, the gate of the regulating PMOS transistor P5, the voltage on the gate of the regulating PMOS transistor P5 will decreases from the second high voltage H2 to the low voltage L, which drives the regulating PMOS transistor P5 into conducting state and provides a current path between the second connection node B and Vpp. That eliminates the floating state at the second connection node B and, compared to the circuits in FIGS. 2 and 3, provides a more stable output voltage of the HVLS circuit.

Figure 5:
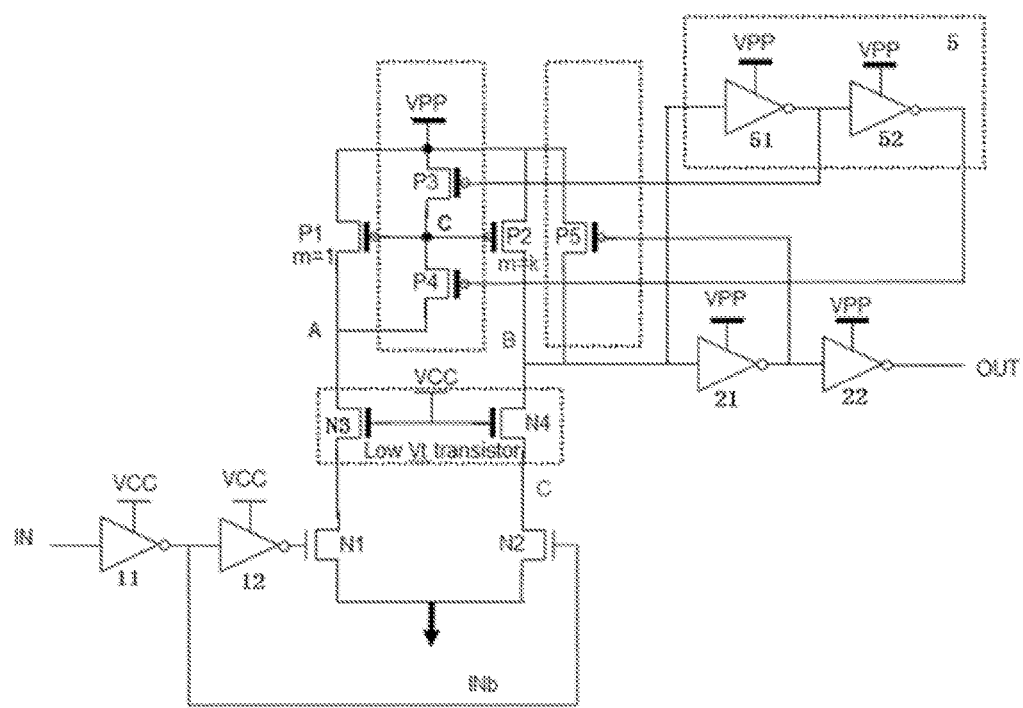
FIG. 5 shows a diagram illustrating a HVLS circuit in accordance with a fourth embodiment of this inventive concept.

FIG. 5 shows a diagram illustrating a HVLS circuit in accordance with a fourth embodiment of this inventive concept. Compared to the HVLS circuit of FIG. 4, the HVLS circuit of FIG. 5 further comprises a fifth transistor N3 and a sixth transistor N4. The fifth transistor N3 is a first low-threshold NMOS transistor, and the sixth transistor N4 is a second low-threshold NMOS transistor.

The third transistor N1 is a first low-voltage NMOS transistor, and the fourth transistor N2 is a second low-voltage NMOS transistor.

A drain of the first low-voltage NMOS transistor is connected to a source of the first low-threshold NMOS transistor, a drain of the second low-voltage NMOS transistor and a drain of the second low-threshold NMOS transistor are connected to the third connection node C.

A gate of the first low-voltage NMOS transistor is connected to the output node of the second input inverter 12. A gate of the second low-voltage NMOS transistor is connected to the output node of the first input inverter 11.

A gate of the first low-threshold NMOS transistor and a gate of the second low-threshold NMOS transistor are connected to a second power source Vcc, a drain of the first low-threshold NMOS transistor and a drain of the first transistor P1 are connected at the first connection node A, a drain of the second low-threshold NMOS transistor and a drain of the second transistor P2 are connected at the second connection node B.

Compared to the HVLS circuit of FIG. 4, two low-threshold NMOS transistors are added to the HVLS circuit in FIG. 5, and two high-voltage NMOS transistors in FIG. 4 (the third transistor N1 and the fourth transistor N2) are replaced by two low-voltage NMOS transistors. That increases the current-driving capability of the HVLS circuit.

Figure 6:
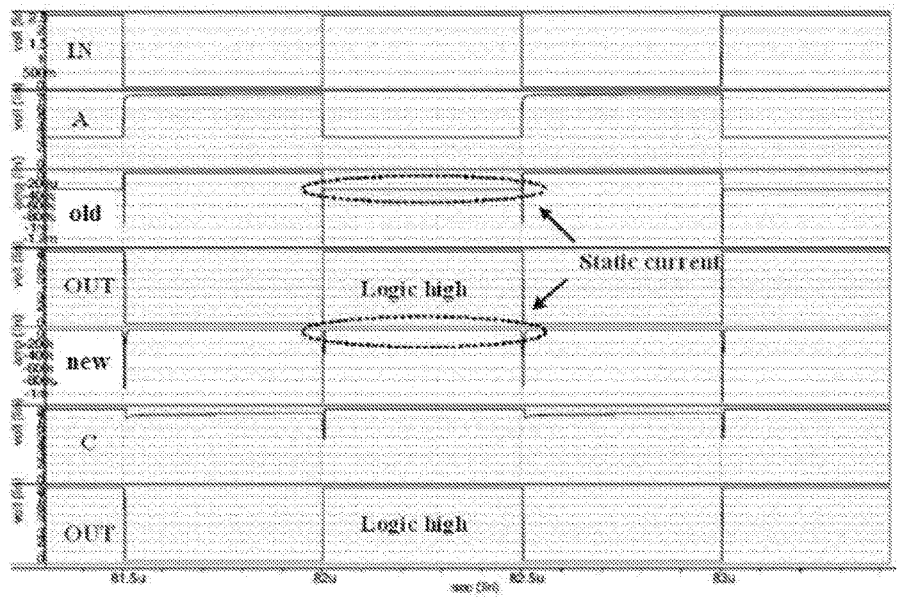
FIG. 6 shows a comparison of the static current of a conventional HVLS circuit and that of the HVLS circuit of FIG. 5.

FIG. 6 shows a comparison of the static current of a conventional HVLS circuit and that of the HVLS circuit of FIG. 5. As shown in FIG. 6, the static current of the HVLS circuit of FIG. 5 is substantially lower than that of a conventional HVLS circuit.

FIG. 6 further shows the voltages at different locations of the circuit, including the first connection node A, the second connection node B, the third connection C, and the output node, under different input signals IN. In the HVLS circuit of FIG. 5, the sixth transistor N4 (a low-threshold NMOS transistor) remains in conducting state, thus the current going through the sixth transistor N4 also goes through the third connection node C and is controlled by the fourth transistor N2. Therefore the third connection node C has an amplitude-reduced voltage. When the input signal is a high voltage, the voltage at the third connection node C equals to output voltage (Vpp).

Figure 7:
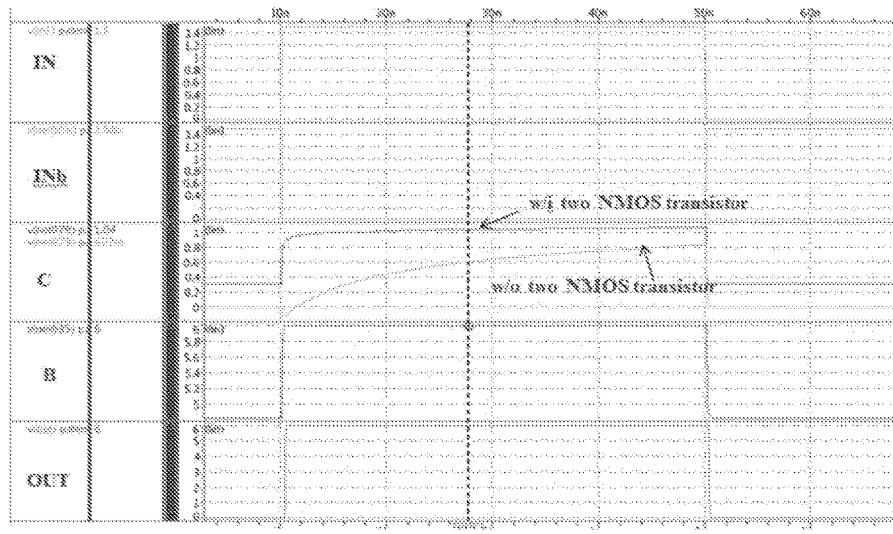
FIG. 7 shows a comparison of floating node outputs of the HVLS circuits of FIGS. 4 and 5.

FIG. 7 shows a comparison of floating node outputs of the HVLS circuits of FIGS. 4 and 5. Referring to FIG. 7, when the input signal is a high voltage, in both HVLS circuits in FIGS. 4 and 5, the voltages in the third connection node C increase. Since the HVLS circuit in FIG. 5 comprises two low-threshold NMOS transistors while the circuit in FIG. 4 does not, the circuit in FIG. 5 has a much faster voltage increase than the circuit in FIG. 4.

In the HVLS circuit in FIG. 5, a regulating PMOS transistor P5 is added to eliminate any floating state on the second connection node B. The circuit comprises two low-threshold NMOS transistors (the fifth transistor N3 and the sixth transistor N4), which help the voltage on the third connection node C to reach a high voltage (and the regulating PMOS transistor P5 to enter conducting state) more quickly. Without these two low-threshold NMOS transistors, as is the case of the HVLS circuit in FIG. 4, the voltage at the second connection node B will gradually increase.

Since the gates of the low-threshold NMOS transistors are connected to the second high voltage Vcc, the voltages on the drains of the third transistor N1 and the fourth transistor N2 are Vcc-Vtn, wherein Vtn is the voltage between the gate and the drain of the low-threshold transistors (the fifth transistor N3 or the sixth transistor N4). When the input signal changes from low voltage L to the first high voltage H1, the voltage at the second connection node B is in a floating state and gradually increases, and the regulating PMOS transistor P5 gradually enters blocking state.

When the input signal is a first high voltage, the fourth transistor N2 is in blocking state, blocking all the currents going through, thus the second connection node is at a floating state. Due to the floating-state-elimination effect of the regulating PMOS transistor P5, the voltage on the second connection node B will gradually change from the low voltage L to the second high voltage H2.

The main purpose of this inventive concept is to lower the amount of static current generated in the voltage conversion process and speed up the conversion process. To achieve this purpose, a delay module is inserted into the circuit between the low voltage GND and the first power source Vpp, and a regulating PMOS transistor is added to eliminate any floating state on the second connection node B when the input signal is a high voltage.

This inventive concept further presents a semiconductor device. This semiconductor device may comprise any one of the HVLS circuits in accordance to this inventive concept, as described above.

In this semiconductor device, a first switch and a second switch are added to a conventional HVLS circuit. Controlled by a switch control circuit, these two switches will not be close (i.e., in conducting state) at the same time. When the input signal is a first high voltage (e.g., logic high), a direct current path between the first power source Vpp and the ground GND is severed, thus the static current generated during the voltage conversion process can be substantially reduced, and the voltage conversion process can be sped up.

In one embodiment, the first switch and the second switch may be controlled by a delay module to reduce the static current and to speed up the conversion process. When the input signal is a high voltage, the delay module may sever the direct current path between the first power source Vpp and the ground GND by controlling the voltage at the gate of a PMOS transistor. In one embodiment, a first transistor P1 and a second transistor P2 in the circuit may each comprise one or more transistors, and the second transistor P2 may comprise k times as many transistors as the first transistor P1. The difference in transistor numbers may further speed up the voltage conversion process.

This concludes the description of a HVLS circuit and related semiconductor devices in accordance with one or more embodiments of this inventive concept. For the purpose of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A high voltage level shifting (HVLS) circuit, comprising:
    a level conversion circuit comprising a first transistor, a second transistor, a third transistor, and a fourth transistor, with the first and the second transistors having a first conductivity type and the third and the fourth transistors having a second conductivity type, wherein the level conversion circuit converts an input signal having a first high voltage to an output signal having a second high voltage that is higher than the first high voltage, and wherein the first transistor is directly connected to the third transistor at a first connection node without any intermediate element, the second transistor is directly connected to the fourth transistor at a second connection node without any intermediate element, and a control node of the first transistor is connected to a control node of the second transistor;
    a first switch having a first node connected to a first power source and a second node connected to the control node of the first transistor;
    a second switch having a first node connected to the control node of the first transistor and a second node connected to the first connection node; and
    a switch control circuit connected to the first switch and the second switch, and controls the first switch and the second switch not to be close at the same time.

2. The HVLS circuit of claim 1, further comprising:
    a regulator circuit connected to the level conversion circuit, wherein the regulator circuit regulates the output signal of the level conversion circuit.

3. The HVLS circuit of claim 2, wherein the first switch is an electrical relay, a P-type Metal-Oxide-Semiconductor (PMOS) transistor, an N-type Metal-Oxide-Semiconductor (NMOS) transistor, an N-P-N transistor, or a P-N-P transistor, and wherein the second switch is an electrical relay, a PMOS transistor, an NMOS transistor, an N-P-N transistor, or a P-N-P transistor.

4. The HVLS circuit of claim 2, further comprising:
    an output buffer comprising:
        a first output inverter having an input node connected to the second connection node; and
        a second output inverter having an input node connected to an output node of the first output inverter, and an output node acting as an output node of the HVLS circuit.

5. The HVLS circuit of claim 4, wherein the regulator circuit comprises:
    a regulating PMOS transistor having a source connected to the first power source, a drain connected to the second connection node, and a gate connected to the output node of the first output inverter.

6. The HVLS circuit of claim 2, wherein the first conductivity type is P type and the second conductivity type is N type.

7. The HVLS circuit of claim 6, wherein the third transistor is a first high-voltage NMOS transistor, the fourth transistor is a second high-voltage NMOS transistor, and wherein a drain of the first high-voltage NMOS transistor is connected to a drain of the first transistor, and a drain of the second high-voltage NMOS transistor is connected to a drain of the second transistor.

8. The HVLS circuit of claim 6, wherein the level conversion circuit further comprises a fifth transistor and a sixth transistor, wherein the fifth transistor is a first low-threshold NMOS transistor, the sixth transistor is a second low-threshold NMOS transistor, the third transistor is a first low-voltage NMOS transistor, and the fourth transistor is a second low-voltage NMOS transistor, wherein a drain of the first low-voltage NMOS transistor is connected to a source of the first low-threshold NMOS transistor, a drain of the second low-voltage NMOS transistor is connected to a drain of the second low-threshold NMOS transistor, and wherein a gate of the first low-threshold NMOS transistor and a gate of the second low-threshold NMOS transistor are connected to a second power source, a drain of the first low-threshold NMOS transistor is connected to a drain of the first transistor, and a drain of the second low-threshold NMOS transistor is connected to a drain of the second transistor.

9. The HVLS circuit of claim 1, wherein the first switch is an electrical relay, a P-type Metal-Oxide-Semiconductor (PMOS) transistor, an N-type Metal-Oxide-Semiconductor (NMOS) transistor, an N-P-N transistor, or a P-N-P transistor, and wherein the second switch is an electrical relay, a PMOS transistor, an NMOS transistor, an N-P-N transistor, or a P-N-P transistor.

10. The HVLS circuit of claim 1, further comprising:
an output buffer comprising:
a first output inverter having an input node connected to the second connection node; and
a second output inverter having an input node connected to an output node of the first output inverter, and an output node acting as an output node of the HVLS circuit.

11. The HVLS circuit of claim 1, wherein the first conductivity type is P type and the second conductivity type is N type.

12. The HVLS circuit of claim 11, wherein the third transistor is a first high-voltage NMOS transistor, the fourth transistor is a second high-voltage NMOS transistor, and wherein a drain of the first high-voltage NMOS transistor is connected to a drain of the first transistor, and a drain of the second high-voltage NMOS transistor is connected to a drain of the second transistor.

13. The HVLS circuit of claim 11, wherein the level conversion circuit further comprises a fifth transistor and a sixth transistor, wherein the fifth transistor is a first low-threshold NMOS transistor, the sixth transistor is a second low-threshold NMOS transistor, the third transistor is a first low-voltage NMOS transistor, and the fourth transistor is a second low-voltage NMOS transistor, wherein a drain of the first low-voltage NMOS transistor is connected to a source of the first low-threshold NMOS transistor, a drain of the second low-voltage NMOS transistor is connected to a drain of the second low-threshold NMOS transistor, and wherein a gate of the first low-threshold NMOS transistor and a gate of the second low-threshold NMOS transistor are connected to a second power source, a drain of the first low-threshold NMOS transistor is connected to a drain of the first transistor, and a drain of the second low-threshold NMOS transistor is connected to a drain of the second transistor.

14. A semiconductor device, comprising the HVLS circuit of claim 1.

15. A high voltage level shifting (HVLS) circuit, comprising:
a level conversion circuit comprising a first transistor, a second transistor, a third transistor, and a fourth transistor, with the first and the second transistors having a first conductivity type and the third and the fourth transistors having a second conductivity type, wherein the level conversion circuit converts an input signal having a first high voltage to an output signal having a second high voltage that is higher than the first high voltage, and wherein the first transistor is connected to the third transistor at a first connection node, the second transistor is connected to the fourth transistor at a second connection node, and a control node of the first transistor is connected to a control node of the second transistor;

a first switch having a first node connected to a first power source and a second node connected to the control node of the first transistor;

a second switch having a first node connected to the control node of the first transistor and a second node connected to the first connection node; and a switch control circuit connected to the first switch and the second switch, and controls the first switch and the second switch not to be close at the same time, wherein the switch control circuit comprises:
a first inverter having an input node connected to the second connection node and an output node connected to a control node of the first switch; and
a second inverter having an input node connected to the output node of the first inverter and an output node connected to a control node of the second switch.

16. A high voltage level shifting (HVLS) circuit, comprising:
a level conversion circuit comprising a first transistor, a second transistor, a third transistor, and a fourth transistor, with the first and the second transistors having a first conductivity type and the third and the fourth transistors having a second conductivity type, wherein the level conversion circuit converts an input signal having a first high voltage to an output signal having a second high voltage that is higher than the first high voltage, and wherein the first transistor is connected to the third transistor at a first connection node, the second transistor is connected to the fourth transistor at a second connection node, and a control node of the first transistor is connected to a control node of the second transistor;

a first switch having a first node connected to a first power source and a second node connected to the control node of the first transistor;

a second switch having a first node connected to the control node of the first transistor and a second node connected to the first connection node;

a switch control circuit connected to the first switch and the second switch, and controls the first switch and the second switch not to be close at the same time; and a regulator circuit connected to the level conversion circuit, wherein the regulator circuit regulates the output signal of the level conversion circuit, wherein the switch control circuit comprises:
a first inverter having an input node connected to the second connection node and an output node connected to a control node of the first switch; and
a second inverter having an input node connected to the output node of the first inverter and an output node connected to a control node of the second switch.

* * * * *